(12) United States Patent
Lee

(10) Patent No.: US 8,514,994 B1
(45) Date of Patent: Aug. 20, 2013

(54) DOUBLE DATA RATE OPERATION IN AN INTEGRATED CIRCUIT

(75) Inventor: Andy L. Lee, San Jose, CA (US)

(73) Assignee: Altera Corporation, San Jose, CA (US)

( * ) Notice: Subject to any disclaimer, the term of this patent is extended or adjusted under 35 U.S.C. 154(b) by 987 days.

(21) Appl. No.: 12/244,568

(22) Filed: Oct. 2, 2008

(51) Int. Cl.
*H04L 7/00* (2006.01)

(52) U.S. Cl.
USPC .......................................... 375/355; 375/354

(58) Field of Classification Search
USPC .................................................. 375/355, 354
See application file for complete search history.

(56) References Cited

U.S. PATENT DOCUMENTS

| | | | |
|---|---|---|---|
| 6,300,792 B1 | 10/2001 | Pederson | 326/38 |
| 6,882,229 B1 * | 4/2005 | Ho et al. | 331/1 A |
| 7,312,632 B2 | 12/2007 | Lewis et al. | 326/39 |
| 7,928,770 B1 * | 4/2011 | Bellis et al. | 326/96 |
| 2002/0136051 A1 * | 9/2002 | Hardee et al. | 365/149 |
| 2006/0123184 A1 * | 6/2006 | Mondal et al. | 711/6 |
| 2006/0132176 A1 | 6/2006 | Lewis | 326/44 |
| 2007/0252617 A1 | 11/2007 | Lewis et al. | 326/41 |
| 2007/0283182 A1 * | 12/2007 | Defazio et al. | 713/500 |
| 2009/0129184 A1 * | 5/2009 | Schuetz | 365/201 |
| 2009/0190431 A1 * | 7/2009 | Gronlund | 365/233.11 |

OTHER PUBLICATIONS

U.S. Appl. No. 11/242,693 entitled "Implementation of Double Data Rate Embedded Memory in Programmable Devices", filed Oct. 3, 2005. (36 pages).

* cited by examiner

*Primary Examiner* — Chieh M Fan
*Assistant Examiner* — Brian J Stevens
(74) *Attorney, Agent, or Firm* — Weaver Austin Villeneuve & Sampson LLP

(57) ABSTRACT

In various embodiments, an integrated circuit may include a number of elements configured to operate at the rate of a supplied clock signal (Single Data Rate, or SDR), and further include other elements configured to operate at twice the rate of the clock signal (Double Data Rate, or DDR). In some embodiments, the circuit may further include elements configured to transform signals between SDR and DDR. In various embodiments, the elements may select a first input during a first phase of a clock signal and select a second input during a second phase of a clock signal to provide a double data rate output. In some embodiments, the elements may form a double data rate portion of the integrated circuit that receives two bits per clock cycle and provides two output bits per clock cycle.

25 Claims, 5 Drawing Sheets

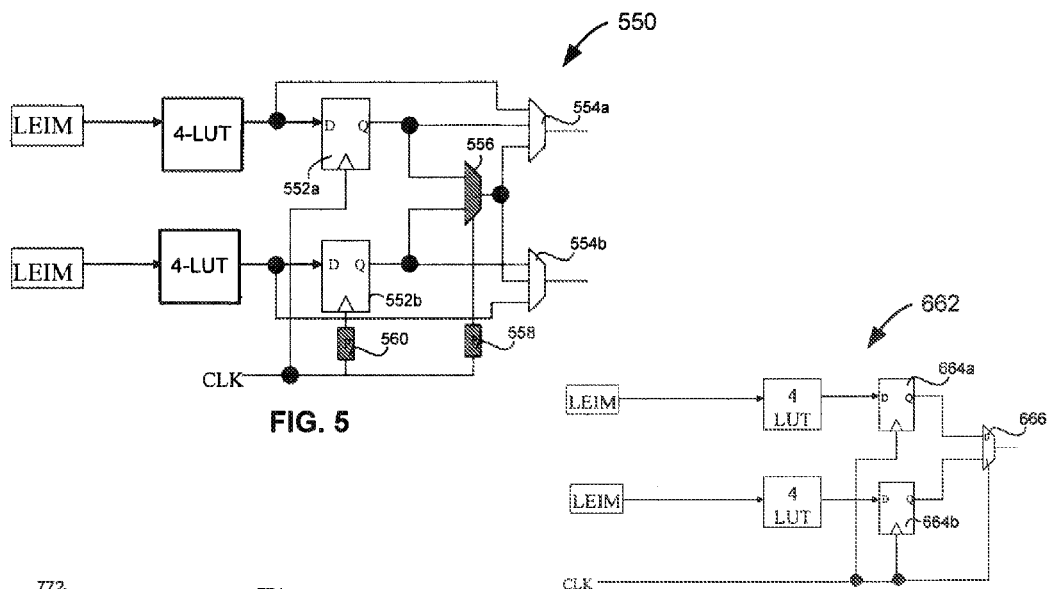
FIG. 5
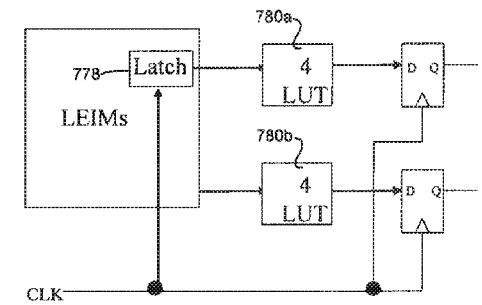
FIG. 6
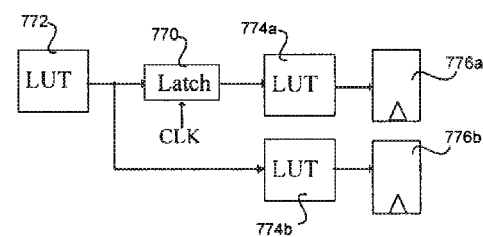
FIG. 7A
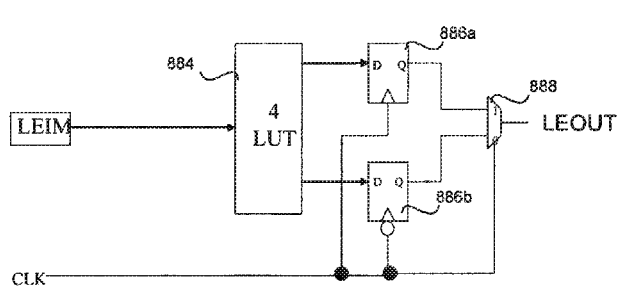
FIG. 7B
FIG. 8

DOUBLE DATA RATE OPERATION IN AN INTEGRATED CIRCUIT

BACKGROUND OF THE INVENTION

1. Field of the Invention

The present invention relates to integrated circuits and their operation.

2. Description of Related Art

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit to have qualities of both an ASIC and a PLD. The term PLD as used herein will be considered broad enough to include such devices.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a look-up table (LUT) or product term, carry-out chain, register, and other elements. LABs (comprising multiple LEs) may be connected to horizontal and vertical lines that may or may not extend the length of the PLD.

Logic elements, including LUT-based logic elements, typically include configurable elements holding configuration data that determine the particular function or functions carried out by the logic element. A typical LUT circuit may include RAM bits that hold data (a "1" or "0"). However, other types of configurable elements may be used. Some examples may include static, magnetic, ferro-electric or dynamic random access memory, electrically erasable read-only memory, flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "memory element" will be used to refer to any programmable element that may be configured to determine functions implemented by a PLD.

As discussed above, PLDs are commonly constructed using a lookup table (LUT) as the basic logic element. For example, a K-input lookup table (K-LUT) typically includes $2^K$ programmable memory elements, and a $2^K$ to 1 multiplexer, selecting one of the storage elements under the control of the K select inputs to the multiplexer. These K inputs can be considered to be the inputs to a K-input logic function which can implement any particular required logic function by setting the contents of the memory elements to the appropriate values.

There is a tradeoff between cost and speed of a logic circuit constructed with LUTs. Typically the cost of each LUT grows exponentially with the choice of K, but the number of LUTs required to build a logic circuit decreases more slowly with larger values of K. However, the number of LUTs that are in series for a larger value of K will be reduced, making the logic circuit faster. Some designs use fracturable LUTs that can be configured as one or more LUTs with different numbers of inputs, for example as either a single 6-LUT or two 4-LUTs. U.S. Pat. No. 7,312,632 provides examples of such fracturable LUTs.

SUMMARY

An integrated circuit according to an embodiment contains elements that perform one operation per clock cycle, and other elements that perform two operations per clock cycle. Elements performing two operations per clock cycle are grouped together into a Double Data Rate (DDR) portion. Logic signals between elements in the DDR portion are sent during each phase of a clock cycle, while logic signals between elements operating in Single Data Rate (SDR) portions are sent only once per clock cycle. Some elements are configured to convert between SDR and DDR formats. Two SDR signals may be multiplexed together by an element. A DDR signal may be demultiplexed by an element to provide two SDR signals. Data integrity may be maintained in a DDR portion using wave pipelining. A pulsed latch may be provided at an intermediate point between registers in a DDR portion to separate logic signals from different phases.

An integrated circuit according to an example includes: a first single data rate portion that contains two or more logic elements each performing one logical operation per cycle of a clock signal; a double data rate portion that contains one or more logic elements each performing two logical operations per cycle of the clock signal, the double data rate portion receiving an input from the first single data rate portion; and a second single data rate portion that contains two or more logic elements each performing one logical operation per cycle of the clock signal, the second single data rate portion receiving an input from the double data rate portion.

An integrated circuit according to another example includes: a plurality of logic elements that each receive a common clock signal, each of the plurality of logic elements containing a lookup table; a first logic element of the plurality of logic elements providing two output bits per clock cycle on an output line; and a second logic element of the plurality of logic elements providing one output bit per clock cycle on an output line, the second logic element connected in series with the first logic element.

A method of operating an integrated circuit according to an example includes: providing a clock signal to a plurality of logic elements that are connected in series, each of the plurality of logic elements containing a lookup table; configuring at least a first logic element of the plurality of logic elements to perform two operations per clock cycle; and configuring at least a second logic element of the plurality of logic elements to perform one operation per clock cycle.

A method of designing an integrated circuit according to an example includes: receiving an unmodified integrated circuit design; searching the unmodified integrated circuit design to identify portions designed to operate as single data rate portions that are reconfigurable as double data rate portions; generating a modified integrated circuit design that including reconfiguration of at least some of the identified portions as double data rate portions; and implementing the modified integrated circuit design.

An integrated circuit according to an example includes: a plurality of logic elements that each receive input signals, perform operations, and provide output signals that are dependant on the input signals; a clock signal provided to the plurality of logic elements, the clock signal having a clock cycle consisting of a high phase and a low phase; and at least a first one of the plurality of logic elements configured to perform a first logical operation on first input signals during a high phase of the clock cycle and perform a second logical operation on second input signals during a low phase of the clock cycle.

BRIEF DESCRIPTION OF THE DRAWINGS

The invention may best be understood by reference to the following description taken in conjunction with the accompanying drawings, which illustrate specific embodiments of the present invention.

FIG. 5 shows an output portion of an adaptive LE, including programmable inverters for clock inputs and a multiplexer receiving outputs of both output registers.

FIG. 6 shows an example of a registered LE configured to convert from SDR to DDR.

FIG. 7A shows an example of latching between LUTs to separate a DDR signal into SDR signals.

FIG. 7B shows an example of a registered LE configured to convert from DDR to SDR using latching in the LEIMs.

FIG. 8 shows an example of a registered LE that is configured for DDR to DDR operation.

FIG. 11 shows a process for designing a PLD and implementing the

DETAILED DESCRIPTION OF ILLUSTRATED EMBODIMENTS

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of integrated circuits in addition to programmable logic devices and application-specific integrated circuit (ASIC) devices.

Figure 1:
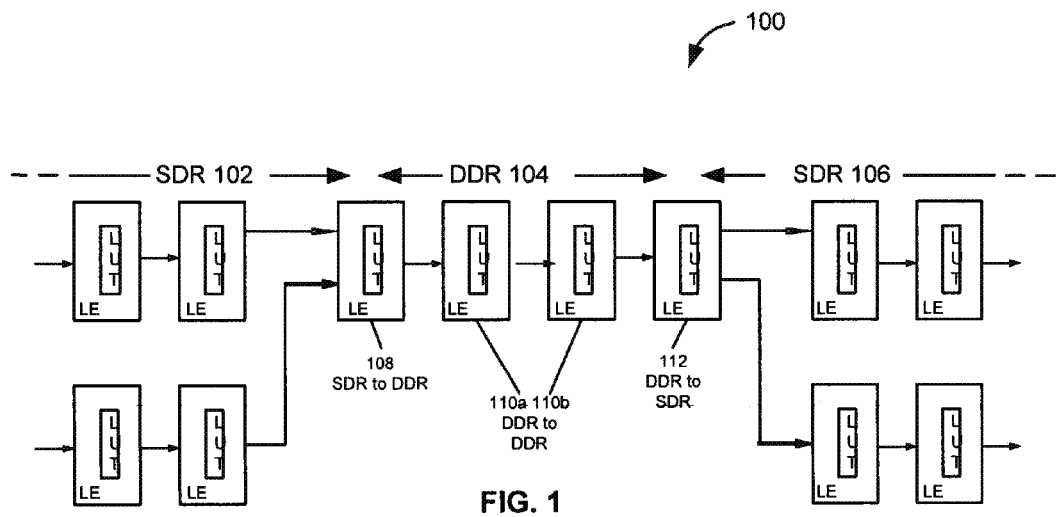
FIG. 1 shows a portion of a portion of a PLD that includes Single Data Rate (SDR) portions and a Double Data Rate (DDR) portion.

FIG. 1 shows an example of a part of a PLD 100 that includes a first Single Data Rate (SDR) portion 102, a Double Data Rate (DDR) portion 104, and a second single DDR portion 106. LEs are all shown as including a LUT and each LE performs some logic operation based on configuration of the LUT. It will be understood that an LE may be configured to have more than one LUT in some examples. FIG. 1 does not show control signals provided to LEs. However, such control signals are well known and may include one or more clock signals. In the example shown, all LEs receive the same clock signal, which is used to control the flow of logic signals between LEs.

LEs may be configured to use output registers (i.e. configured as registered LEs). Alternatively, LEs may be configured so that registers are not used, in which case they may be considered as combinational or combinatorial LEs. The outputs of combinational LEs change as their inputs change, whereas outputs of registered LEs change with the register outputs, which generally change after the clock signal changes.

A registered LE in an SDR portion may be considered to be operating in a normal, or default mode where one logic operation is performed per clock cycle. This means that a set of input bits are received by the LE and an output bit or bits are sent out for every clock cycle.

In the DDR portion, two sets of input bits are received, and two output bits are sent out of an LE for each clock cycle. Thus, the DDR portion performs at twice the throughput of the SDR portions so that a smaller number of LEs may be needed. By using LEs in DDR mode where possible, a space saving may be achieved thus lowering cost. The choice between DDR and SDR mode may depend on a number of factors, but in general DDR mode may be considered preferable because of the space saving. The reduced number of LEs required may also allow a particular set of logic operations to be performed within fewer structures, such as LABs, thus reducing use of routing resources. Thus, for example a calculation that in SDR mode would require LEs from two different LABs (with the time delay and complexity involved) can be achieved within a single LAB and thus be performed more rapidly and without using inter-LAB routing fabric. Shorter paths may also result in less delay.

In addition to LEs operating in SDR mode, FIG. 1 shows an LE 108 that performs SDR to DDR conversion, LEs 110a, 110b that operate in DDR mode (i.e. receive and send data at double data rate), and an LE 112 that performs DDR to SDR conversion. In an example LE design, an LE is configurable to perform in any one of these modes so that DDR may be implemented at any location within the PLD.

Figure 2A:
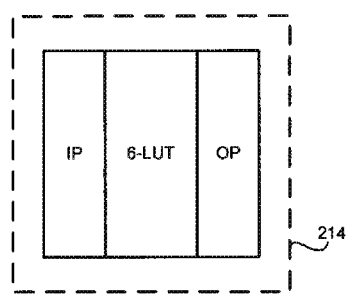
FIG. 2A shows an example of an adaptive LE that is configured in 6-LUT mode.

FIG. 2A shows an LE 214 that may be used to implement aspects of the present invention. LE 214 is an Adaptive LE (ALE), which can operate in two different modes. In a first mode shown in FIG. 2A, ALE 214 operates as a 6-LUT (i.e. a lookup table with 6 inputs). In addition to the 6-LUT, input (IP) and output (OP) circuits route data to and from the 6-LUT. Operating in 6-LUT mode may provide an efficient use of space where a large number of inputs are to be processed.

Figure 2B:
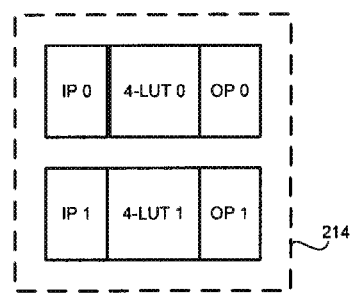
FIG. 2B shows an example of an adaptive LE that is configured in 4-LUT mode.

FIG. 2B shows LE 214 in a second mode. Here, ALE 214 is operating in 4-LUT mode, with ALE 214 containing two 4-LUTs, 4-LUT 0, and 4_LUT 1. In addition to the 4-LUTs, input and output circuits are configured to provide input signals to the two 4-LUTs so that the two portions of the ALE may be considered as separate LEs (sometimes referred to as Basic LEs, or BLEs). It will be understood that the hardware of FIGS. 2A and 2B is the same and that the different functional blocks shown are the result of configuration that is implemented using programmable circuits (not shown), which configure ALE 214 in the appropriate mode based on design requirements.

In some examples presented here, latching is added to an LE to facilitate operation in DDR mode. Latching may be added at either the input side or output side (i.e. in IP or OP circuits of FIGS. 2A and 2B). Examples of both input side latching and output side latching are described below. Such latching may be added to conventional LE designs in any suitable manner, and the present invention is not limited to a particular implementation.

Figure 3A:
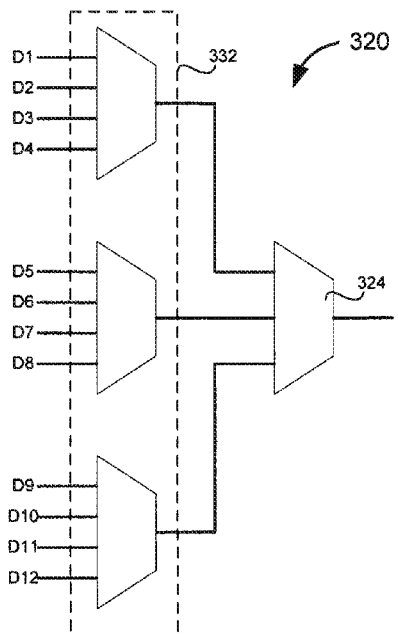
FIG. 3A shows first and second stages of a LE input multiplexer (LEIM).

In a first example, latching is implemented in input circuits of an LE. FIG. 3A shows a portion of the input circuits of an LE. In particular, FIG. 3A shows an LE input multiplexer (LEIM) 320 that consists of two stages, a first stage 332 and a second stage 324. Note that FIG. 3A shows a 12:1 LEIM for clarity, while practical implementations may use 36:1 LEIMs, or other LEIMs with a greater number of inputs.

Figure 3B:
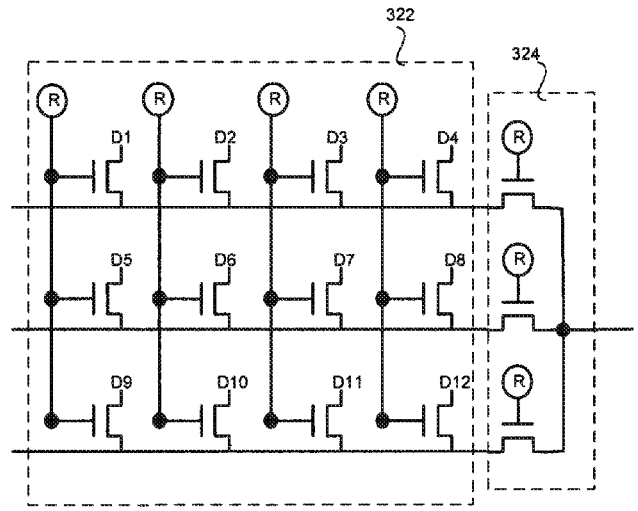
FIG. 3B shows an example of hardware used to implement the LEIM of FIG. 3A.

FIG. 3B shows hardware used to implement LEIM 320 according to one example. In particular, FIG. 3B shows a set of inputs marked as "R" that are configurable inputs used to configure LEIM 320 to select one of the logic inputs D1-D12 according to the desired function of the LE. Configurable inputs are configured through CRAM. FIG. 3B shows first stage LEIM 322 and second stage LEIM 324. Second stage LEIM 324 of FIG. 3B includes three transistors with gates controlled by CRAM bits. The second stage in this example does not include latching. This arrangement may be used where latching is provided elsewhere in an LE.

Figure 3C:
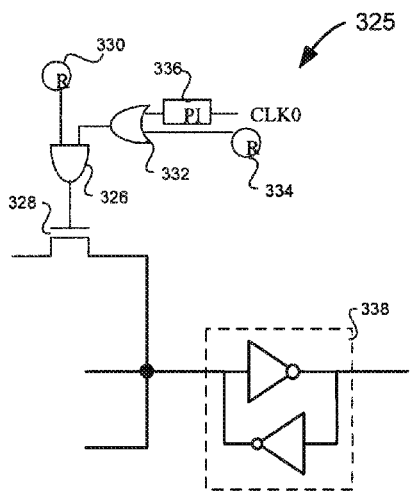
FIG. 3C shows alternative hardware used to implement latching in a second stage of an LEIM.

FIG. 3C shows a portion of a second stage LEIM 325 that provides latching of logic signals. Instead of controlling the gates of transistors using only a CRAM bit as in LEIM 324 of FIG. 3B, additional components are added to allow other options. In particular, an AND gate 326 is added to the gate of a transistor 328 (only one transistor is shown for clarity, other transistor gates also have similar modification). One input to the AND gate is provided by a CRAM bit 330, while the other is the output of an OR gate 332. OR gate 332 receives one input from a CRAM bit 334, while the other input is provided by a clock signal CLK0, with a programmable inverter 336. Thus, if both CRAM bits 330, 334 are logic 1, then the gate will receive a logic 1 voltage and transistor 328 remains on, thus selecting the input of the transistor 328. If both CRAM bits 330, 334 are logic 0, then the gate receives a logic 0 voltage and the transistor 328 remains off and the input is not selected. Thus, conventional operation (permanently selecting or deselecting an input) can be provided by appropriate CRAM configuration. However, if AND gate 326 input CRAM bit 330 is logic 1, and OR gate 332 input bit 334 is logic 0, then the gate receives the clock signal CLK0, or its inverse, depending on whether programmable inverter 336 is enabled. Thus, transistor 328 turns on only during one phase of the clock cycle, with the particular phase being selected using the programmable inverter. FIG. 3C also shows a transparent latch 338 provided in second stage 325. Latch 338 provides the present input, or the last received input signal. Thus, if transistor 328 turns on during the positive phase of the clock signal and turns off during the negative phase, the latch passes through the logic signal from the transistor during the positive phase, and maintains the same logic signal during the subsequent negative phase. Thus, even though latch 338 is a transparent latch (its output changes when its input changes) the input only changes during one phase of the clock cycle so that the second stage acts as a clocked latch. It will be understood that latching in input circuits of an LE may be implemented in many different ways and this is just one example.

Figure 4:
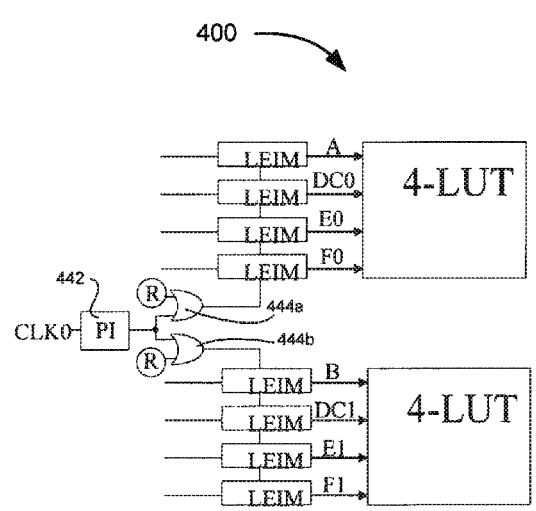
FIG. 4 shows input circuits of an adaptive LE in 4-LUT mode, the input circuits including configurable latches.

FIG. 4 shows an implementation of an ALE 400 that incorporates latching in its input circuits. In particular, each LEIM includes latching as shown in LEIM 325 of FIG. 3C, with certain components shared between LEIMS. The clock signal CLK 0 is provided through a single programmable inverter 442 for all LEIMs. However, the clock signal passes through two different OR gates 444a, 444b, one for LEIMs of each 4-LUT. Thus, LEIMs of one 4-LUT may operate in a conventional manner, while LEIMs of the other 4-LUT are latched. However, even with some sharing of components, this example requires addition of an AND gate to each second stage LEIM transistor. In the present example, this means three AND gates per LEIM (i.e. twenty four AND gates). In other examples with larger second stage multiplexers, more AND gates may be needed to implement this design.

In alternative designs, latching is implemented in output circuits of an LE. Such latching may be implemented using fewer additional components than required for latching in input circuits and therefore may be preferred in some cases. Two alternative examples of output side latching are illustrated in FIG. 5.

FIG. 5 shows the output circuits of an ALE 550. Specifically, FIG. 5 shows the output of the two 4-LUTs (ALE 550 is operating in 4-LUT mode here) being provided to output registers 552a, 552b. The outputs from output registers 552a, 552b go to output multiplexers (muxes) 554a, 554b, which also receive the 4-LUT outputs directly (bypassing output registers 552a, 552b), thus allowing output bits to go through output registers 552a, 552b, or to bypass output registers. When the ALE is in registered mode, the outputs of output registers 552a, 552b are selected. FIG. 5 shows an additional multiplexer 556, which accepts the outputs of the output registers 552a, 552b and provides an additional output to both of the output multiplexers 554a, 554b. Additional multiplexer 556 is supplied with the same clock signal that is supplied to output registers 554a, 554b, with a programmable inverter 558 added to allow additional multiplexer 556 to receive either an unmodified clock signal or an inverted clock signal. This provides additional flexibility allowing either input to be selected on at a particular clock phase. For example, the input coming from output register 552a may be selected on either the high phase or the low phase of the clock cycle. A programmable inverter 560 is also provided to on the clock input to output register 552b so that output registers 552a, 552b may both receive unmodified clock signals, or can receive clock signals that are opposite in phase.

In some embodiments of the present invention, latching may be provided in the output circuits of an ALE. This may replace the latching shown in input circuits of the LE in FIG. 3C. In one example, output registers are reconfigured to provide such latching. In particular, output registers 552a, 552b of FIG. 5 may be configured to act as latches and thus perform the latching function for the LE. For example, output register 552a may latch data on a particular clock phase.

Alternatively, output multiplexers may be supplied with a clock signal which selects an input according to the clock signal. This may be achieved by modifying the output multiplexers in a similar manner to the modification of LEIMs previously shown in FIG. 3C. For example, output multiplexers may have a clock signal with a programmable inverter that can be provided as a select signal, so that the selected output is only provided during a chosen clock phase. The output is provided to a transparent latch so that the latch maintains the output signal through a subsequent clock phase. FIG. 5 shows output multiplexers 554a, 554b which may be used to provide latching in a similar manner to that shown in second stage input mux 325 in FIG. 3C. In particular, a clock signal may be provided to output multiplexers 554a, 554b so that an input is selected during a particular clock phase and can be latched to provide a latched output. Additional multiplexer 556 may also be configured to provide latching in a similar manner FIG. 6 shows a registered ALE 662 configured to perform SDR to DDR conversion. Here, inputs to both LUTs are SDR inputs. This means that each 4-LUT provides output bits at a rate of once per clock cycle. Output registers 664*a*, 664*b* receive the same clock signal CLK (programmable inverter for output register is off, not inverting) so that both register data once per clock signal at the same time. The outputs of the two output registers 664*a*, 664*b* are sent to the additional multiplexer 666, which also receives the clock signal as a selecting input. This clock signal causes the top input and the bottom input to be alternately selected as the clock signal cycles from low to high. So, when the clock signal is low, the top input (from the top output register) is selected, and when the clock signal is high, the bottom input (from the bottom output register) is selected. Thus, additional multiplexer 666 multiplexes together two SDR inputs into a DDR output.

FIG. 7A shows a simplified view of how a latch 770 may be used to facilitate DDR to SDR conversion. Here, an output of a LUT 772 that operates in DDR mode is provided to latch 770, which is clocked so that it latches once per clock cycle thus providing an output that reflects alternate bits (e.g. even bits) of the DDR output of LUT 772. Such an output may be considered an SDR output because it contains only one bit per clock cycle. This output is supplied to LUT 774*a*. The output of LUT 772 is also supplied directly (not latched) to LUT 774*b* (LUTs 774*a*, 774*b* may be in the same ALE). Output registers 776*a*, 776*b* of LUTs 774*a*, 774*b* are clocked together so that only the output corresponding to alternate bits (e.g. odd bits) are output from LUT 774*b*. Thus, two SDR outputs are provided corresponding to odd and even bits of the DDR signal. FIG. 7A does not show input or output circuits associated with LUTs 772, 774*a*, 774*b* or the location of latch 770 with respect to such circuits. The location of latch 770 is not critical to the operation of this example. Latch 770 may be implemented in output circuits of LUT 772, input circuits of LUTs 774*a*, 774*b*, between LUTs 774*a*, 774*b* and output registers 776*a*, 776*b*, or may be implemented in another location.

FIG. 7B shows a specific example where a latch is implemented in the input circuits (LEIMS) of an ALE. Here latch 778 is enabled in the top LEIMs (those providing input to the top 4-LUT 780*a*), but not enabled in the lower LEIMs (those providing input to the bottom 4-LUT 780*b*). Latch 778 is triggered by a clock signal so that it provides an input to the top 4-LUT 780*a* that corresponds to the high phase of the clock cycle. Meanwhile, the input to the bottom 4-LUT 780*b* is not latched. This example may be implemented using the LEIM hardware shown previously in FIGS. 3C and 4.

FIG. 8 shows an example of a registered LE 882 operating in DDR to DDR mode. The output from a 4-LUT 884 is provided to both output registers 886*a* and 886*b* in this example. The top output register 886*a* receives an unmodified clock signal, while the lower output register 886*b* receives an inverted clock signal. Thus, data is registered on both phases of the clock signal and the outputs from the two output registers 886*a*, 886*b* are multiplexed together using an additional multiplexer 888 with the clock signal. The operation of a registered LE in SDR to SDR mode is conventional operation that does not require multiplexing of outputs of FIG. 8. Operation of the DDR to DDR combinatorial LE is the same as operation of a SDR to SDR combinatorial LE, i.e. outputs change as inputs change, but with higher throughput in the DDR case.

Figure 9:
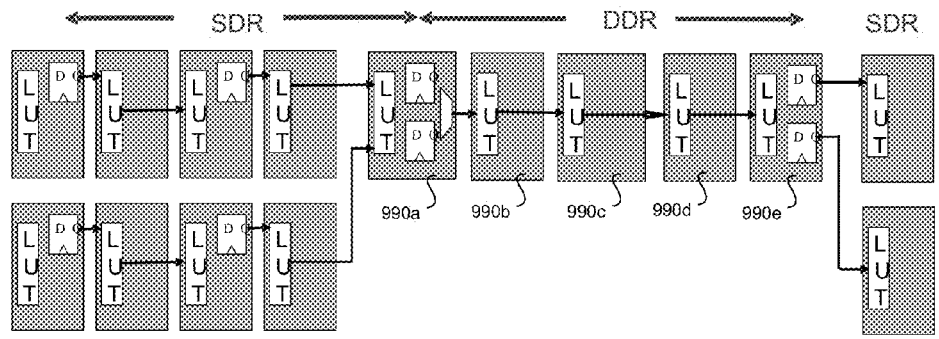
FIG. 9 shows a portion of a PLD including a DDR portion operating using wave pipelining.

FIG. 9 shows an example where certain LEs 990*a*, 990*e*, are configured as registered LEs with intermediate LEs 990*b*, 990*c*, 990*d* configured as combinatorial LEs without registers (i.e. output registers are bypassed). In this example, data integrity is maintained between registered LEs by wave pipelining (i.e. data integrity depends on having sufficient time between data of different clock cycles and no buffering is provided). However, wave pipelining may not allow a large number of combinatorial LEs without a risk of signal corruption. This is because signals that travel over different paths may overlap at a destination, even though they originated at different times (i.e. different clock cycles or different clock edges). This is particularly a problem for DDR operation where data is sent on both rising and falling edges, so that there is less margin for separation of logic signals. Providing a large number of registered LEs to avoid this problem increases delay. This tends to reduce any increased speed obtained by DDR operation. While FIG. 9 shows logic signals passing through LEs along a row, this is to provide a clear illustration, and it will be understood by those skilled in the art that logic pathways are not limited to any particular pattern and may be considerably more complex than the arrangement shown. Other figures are similarly simplified but aspects of the present invention will be understood to apply to LEs in any practical configuration and are not limited to the configurations shown.

Figure 10A:
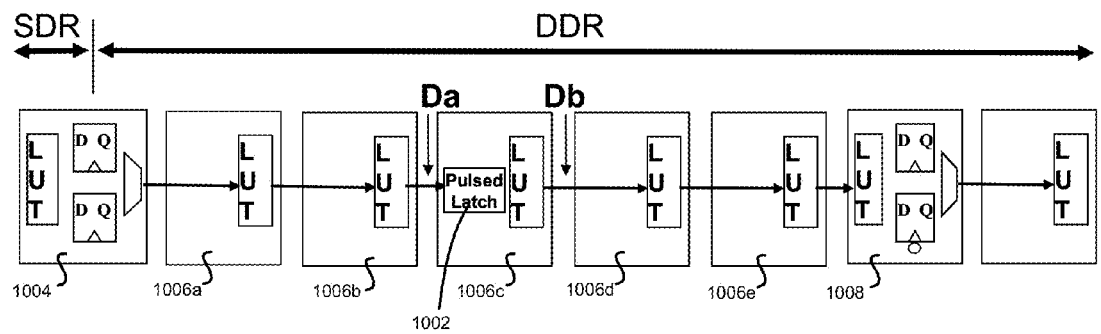
FIG. 10A shows a portion of a PLD including a DDR portion that includes a pulsed latch to maintain data integrity.

FIG. 10A shows an alternative arrangement where a pulsed latch 1002 is used to maintain data integrity through multiple LEs. In particular, FIG. 10*a* shows a registered LE 1004 (performing SDR to DDR conversion) followed by five combinatorial LEs 1006*a-e* and another registered LE 1008. Thus, there is a logical path 6-LEs long between registered LEs. Using wave pipelining to maintain data integrity over such a long path in DDR mode may be too risky. Therefore, as shown a pulsed latch 1002 is added to an intermediate LE 1006*c* (in this example, at a midpoint between registered LEs) to maintain data integrity. In particular, pulsed latch 1002 prevents data from different clock edges from overlapping.

Figure 10B:
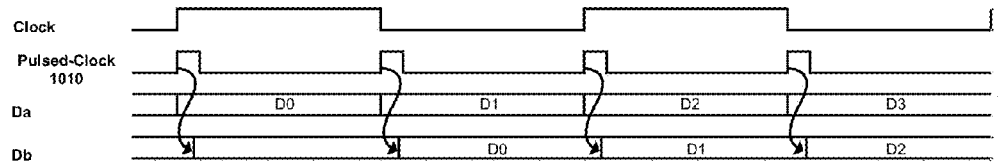
FIG. 10B shows a timing diagram of data flow through the DDR portion of FIG. 10A.

FIG. 10B is a timing diagram showing data (D0-D3) at two points, Da and Db of FIG. 10A during multiple clock cycles. Pulsed latch 1002 uses a pulsed clock signal 1010 having a pulse width that is less than the fastest delay from the previous registered LE 1004 to pulsed latch 1002. Thus, pulsed latch 1002 does not allow logic signal originating at registered LE 1004 to pass through latch 1002 on the same half-cycle. During a first high phase, data D0 is provided at Da and at the falling edge, this data is latched and provided out to Db (with some small delay, as shown). Latch 1002 is closed before the next data D1 arrives at Da. Thus, pulsed latch 1002 separates data from different clock phases but does not cause excessive delay. A pulsed latch may be implemented in hardware in either the input circuits or output circuits. The pulsed latch may be implemented using a latching hardware according to any of the examples described above (or using alternative hardware).

The location of a pulsed latch, like other design parameters, may be chosen according to particular needs. In some cases, these choices may be automated through software used to facilitate design of PLDs. In particular, such software may analyze logic paths to see where there is a danger of data bits originating at different clock edges overlapping. A pulsed latch may be inserted at such a point.

A design system may also choose where to implement DDR portions in a PLD. In this case DDR portions may be implemented in a manner that is transparent to a customer or to a user of the design system. This provides the customer with a lower price for the same functionality because of reduced area. A design system is generally provided as a combination of hardware and software. Such design software is generally provided in a computer readable storage medium such as a hard disk drive (HDD), CD ROM, or flash memory. Design software may be executed on a general purpose computer, or on hardware that is adapted for computer assisted design, for example a workstation with multiple processors, or a mainframe computer. Thus, a computer design system may be formed by a combination of software and hardware. Such software may be available over a network such as an intranet, or the internet.

Figure 11:
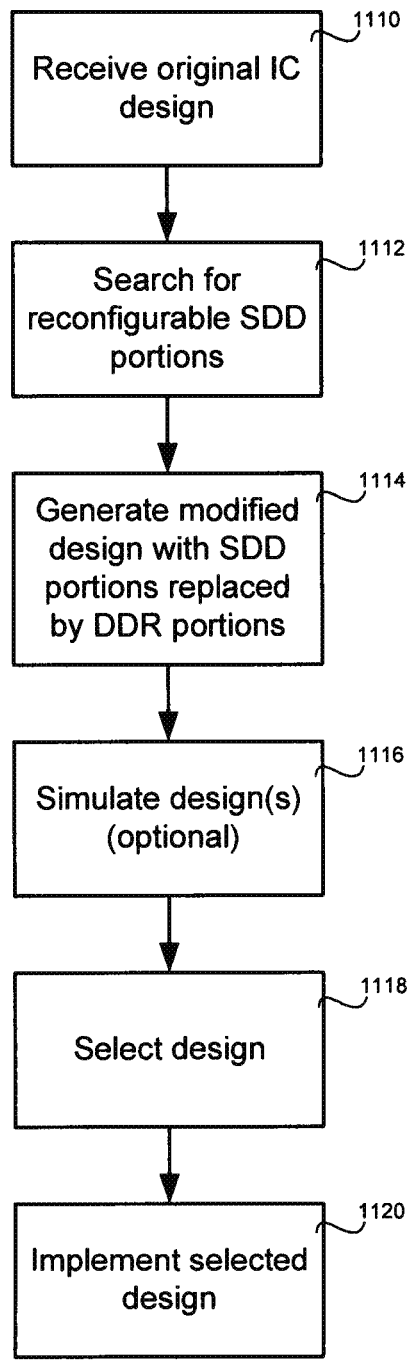

According to an example shown in FIG. 11, an integrated circuit (IC) design may be received by a design system 1110, for example as a file stored in a computer readable storage medium. For example, such a design may be received as a high level design language file (e.g. Verilog file). The IC design may include certain programmable logic portions that are configured as SDR portions, but which could be reconfigured as DDR portions. In general, combinatorial portions of a PLD (combinatorial LEs between registered LEs) may be reconfigured as DDR portions because this does not change locations of registers required in the IC design. Registers required in the IC design are generally kept in place, so portions of a PLD containing a registered LE may not be reconfigurable. A search is performed 1112 to identify any SDR portions that may be reconfigurable as DDR portions. When such reconfigurable portions have been identified, a modified design is generated 1114 in which some or all of the identified SDR portions are replaced by DDR portions. Generally, this will result in a saving in space and hence lower cost. In some cases, performance will also be improved.

While a modified IC design may require different hardware components, programmable logic may be used to provide different designs using the same hardware. For example, different designs may be mapped to an FPGA in different ways, thus using the same hardware with different configurations. The modified design in this case is a software compiled design generated from the received IC design. In an optional step, simulations may be performed 1116 on the original design and the modified design to determine what improvement (if any) has been achieved. Additional modified designs may be generated with different replacement schemes replacing different SDR portions by DDR portions. Such additional modified designs may also be simulated for comparison as part of optimizing the modified IC design. When a particular modified design is identified as being desirable, e.g. better than original design (and any alternative modified designs that may have been generated), this modified design is selected 1118 for implementation. Where no simulation is performed, the modified design may be automatically selected.

The selected design is then implemented 1120 to make an operational circuit. This may mean that the selected design is used to generate patterns that are used in production of ICs from Silicon wafers. The resulting ICs generally have lower cost and/or better performance than ICs made using the original IC design. Thus, implementation may include the production of integrated circuits, or may include sending the selected IC design to a third party so that the third party may then fabricate the ICs. Implementation of a design may alternatively mean using the selected design to configure a predefined hardware such as an FPGA in a selected manner. In another arrangement, implementation may mean a combination of hardware implementation and configuration of predefined hardware. For example, a design may be implemented as a structured ASIC (e.g. HardCopy® structured ASIC from ALTERA corp.)

While the above scheme indicates that DDR replacement of SDR portions may be performed opportunistically by an appropriate design system, DDR may also be implemented in an IC design from its inception. In other words, an IC designer who is aware that DDR LEs are an option in a PLD may choose to have some or all portions of a PLD configured to operate in DDR mode. Thus, in certain embodiments, DDR portions of a PLD or other IC are not the result of replacement of SDR portions, but are initially provided as DDR portions.

While the invention has been particularly shown and described with reference to specific embodiments thereof, it will be understood by those skilled in the art that changes in the form and details of the disclosed embodiments may be made without departing from the spirit or scope of the invention. It is therefore intended that the invention be interpreted to include all variations and equivalents that fall within the true spirit and scope of the present invention.

What is claimed is:

1. An integrated circuit comprising:
a first single data rate portion that contains two or more elements, each element configured to perform one operation per cycle of a clock signal;
a double data rate portion that contains one or more elements each configured to perform two operations per cycle of the clock signal, the double data rate portion configured to receive a first input and a second input from the first single data rate portion, wherein the double data rate portion is configured to select the first input upon a first edge of the cycle of the clock signal and select the second input upon a second edge of the cycle of the clock signal to provide a double data rate output; and
a second single data rate portion that contains two or more elements each configured to perform one operation per cycle of the clock signal, the second single data rate portion configured to receive an input from the double data rate portion.

2. The integrated circuit of claim 1 wherein individual elements of the integrated circuit are configurable as either double data rate elements or single data rate elements.

3. The integrated circuit of claim 1 wherein the first single data rate portion, the double data rate portion, and the second single data rate portion are within a logic array block and the clock signal is a common clock signal for all elements of the logic array block.

4. The integrated circuit of claim 1 wherein the double data rate portion is configured to use wave pipelining to maintain data integrity.

5. The integrated circuit of claim 1 wherein the double data rate portion includes a pulsed latch in between two elements of the double data rate portion.

6. The integrated circuit of claim 1 wherein an element contained in the double data rate portion is configured to perform a logic operation during each of a high phase and a low phase of the clock signal, while an element contained in the single data rate portion is configured to perform only one operation during a complete clock cycle of the clock signal.

7. The integrated circuit of claim 1 further comprising a converting element configured to receive two single data rate inputs and provide a double data rate output.

8. The integrated circuit of claim 7 wherein the converting element includes a multiplexer that is configured to select one of the two single data rate inputs during the first clock phase and selects the other of the other one of the two single data rate inputs during the second clock phase.

9. The integrated circuit of claim 1 further comprising a converting element configured to receive a double data rate input and provide two single data rate outputs.

10. The integrated circuit of claim 9 wherein the converting element includes a latch that is configured to latch at one point of the clock cycle to provide latched data as a single data rate output, the other single data rate output provided by unlatched data.

11. An integrated circuit comprising:
a plurality of elements, wherein each element of the plurality of elements is configured to receive a common clock signal, and wherein each element of the plurality of elements contains a lookup table;
a first element of the plurality of elements configured to provide two output bits per clock cycle on an output line;
a second element of the plurality of elements, the second element configured to provide an input to the first element, the second element configured to receive two bits per clock cycle and providing two output bits per clock cycle;
a third element of the plurality of elements configured to provide one output bit per clock cycle on an output line, the second element connected in series with the first element; and
a fourth element of the plurality of elements, wherein an output of the first element is configured to provide to both the third element and the fourth element to provide one bit per clock cycle to each of the third and fourth elements.

12. The integrated circuit of claim 11 wherein the first element and the second element form a double data rate portion of the integrated circuit, and wherein the double data rate portion includes a latch between elements.

13. The integrated circuit of claim 12 wherein the latch is controlled by a pulse having a pulse width that is less than the shortest logic signal delay between a register and the latch.

14. The integrated circuit of claim 12 wherein the double data rate portion is configured to use wave pipelining to maintain data integrity.

15. The integrated circuit of claim 11 further comprising a fifth element and a sixth element of the plurality of elements, each of the fifth and sixth elements configured to provide one bit per clock cycle to the first element.

16. A method of operating an integrated circuit comprising:
providing a clock signal to a plurality of elements that are connected in series, each element of the plurality of elements containing a lookup table;
configuring at least a first element of the plurality of elements to perform two logic operations per clock cycle, wherein the first element is operative to receive two bits per clock cycle and provide two output bits per clock cycle;
configuring at least a second element of the plurality of elements to perform one logic operation per clock cycle;
configuring additional elements of the plurality of elements to perform two logic operations per clock cycle, the first element and the additional elements forming a double data rate portion of the integrated circuit; and
providing a pulse to a latch between elements of the double data rate portion of the integrated circuit.

17. The method of claim 16 wherein the at least a first element is further configured to receive two inputs each at a rate of one bit per clock cycle.

18. The method of claim 16 further comprising configuring an element as a conversion element that receives an input at a rate of two bits per clock cycle and provides two outputs each at a rate of one bit per clock cycle.

19. A method of designing an integrated circuit comprising:
receiving an unmodified integrated circuit design;
searching the unmodified integrated circuit design to identify portions designed to operate as single data rate portions that are reconfigurable as double data rate portions; and
generating, at a computer system comprising computer hardware, a modified integrated circuit design, wherein the generating includes reconfiguration of at least some of the identified portions as double data rate portions, wherein the at least some of the identified portions are operative to receive two bits per clock cycle and provide two output bits per clock cycle, and wherein the double data rate portions are configured to receive a first input and a second input from the single data rate portions, wherein the double data rate portions are configured to select the first input upon a first edge of the cycle of the clock signal and select the second input upon a second edge of the cycle of the clock signal to provide a double data rate output.

20. The method of claim 19 further comprising implementing the modified integrated circuit design by forming a plurality of integrated circuits on a substrate.

21. An integrated circuit comprising:
a plurality of elements each configured to receive input signals, perform logic operations, and provide output signals that are dependent on the input signals;
a clock signal provided to the plurality of elements, the clock signal having a clock cycle consisting of a high phase and a low phase; and
at least a first one of the plurality of elements configured to perform a first operation on first input signals during a high phase of the clock cycle and perform a second operation on second input signals during a low phase of the clock cycle, wherein the first one of the plurality of elements is further configured to provide a double data rate output signal based on the first operation and the second operation; and
a latch between adjacent elements, the latch controlled by a pulse having a pulse width that is less than a delay between a register and the latch.

22. The integrated circuit of claim 21 wherein at least a second one of the plurality of elements is configured to perform only one operation during the entire clock cycle.

23. The integrated circuit of claim 21 wherein the integrated circuit comprises a programmable logic device.

24. The integrated circuit of claim 21 wherein each of the elements comprises a logic element.

25. The integrated circuit of claim 21 wherein each of the operations comprises a logic operation.

* * * * *